United States Patent
Yoo et al.

(10) Patent No.: US 8,503,246 B2
(45) Date of Patent: Aug. 6, 2013

(54) SEMICONDUCTOR MEMORY DEVICE AND METHOD OF OPERATING THE SAME

(75) Inventors: Byoung Sung Yoo, Gyeonggi-do (KR); Jin Su Park, Daegu (KR)

(73) Assignee: Hynix Semiconductor Inc., Gyeonggi-do (KR)

(*) Notice: Subject to any disclaimer, the term of this patent is extended or adjusted under 35 U.S.C. 154(b) by 97 days.

(21) Appl. No.: 13/167,103

(22) Filed: Jun. 23, 2011

(65) Prior Publication Data
US 2012/0008385 A1    Jan. 12, 2012

(30) Foreign Application Priority Data
Jul. 9, 2010 (KR) .................. 10-2010-0066491

(51) Int. Cl.
G11C 16/04    (2006.01)
(52) U.S. Cl.
USPC ............. 365/185.19; 365/185.18; 365/185.22
(58) Field of Classification Search
USPC ................... 365/185.19, 185.18, 185.22
See application file for complete search history.

(56) References Cited

U.S. PATENT DOCUMENTS

| 7,986,560 B2* | 7/2011 | Park et al. ............... 365/185.22 |
| 2010/0229007 A1* | 9/2010 | Park .......................... 713/193 |
| 2010/0259983 A1* | 10/2010 | Yoon ..................... 365/185.12 |
| 2010/0329021 A1* | 12/2010 | Lee ........................ 365/185.19 |
| 2012/0008385 A1* | 1/2012 | Yoo et al. ................ 365/185.2 |

FOREIGN PATENT DOCUMENTS

KR    1019950000273    1/1995

OTHER PUBLICATIONS

Notice of Preliminary Rejection issued from Korean Intellectual Property Office on Sep. 21, 2011.

* cited by examiner

Primary Examiner — Pho M Luu
(74) Attorney, Agent, or Firm — IP & T Group LLP

(57) ABSTRACT

A semiconductor memory device includes a memory cell array including cell strings each including a plurality of memory cells, bit lines coupled to the respective cell strings, and page buffers configured to compare a reference current and currents of the respective bit line and output sense data corresponding to a level of a threshold voltage of a selected memory cell based on a result of the comparison, in a sense operation.

24 Claims, 6 Drawing Sheets

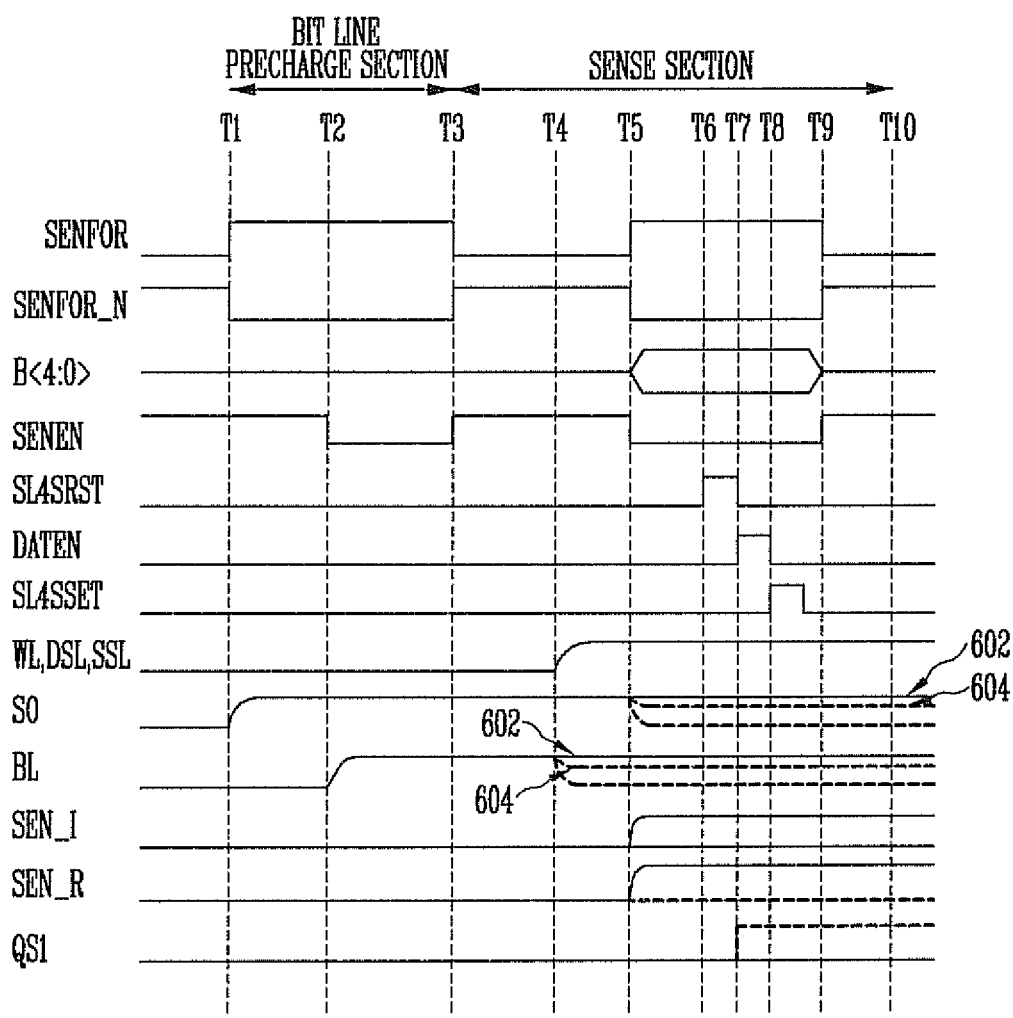

SEMICONDUCTOR MEMORY DEVICE AND METHOD OF OPERATING THE SAME

CROSS-REFERENCE TO RELATED APPLICATION

Priority to Korean patent application number 10-2010-0066491 filed on Jul. 9, 2010, the entire disclosure of which is incorporated by reference herein, is claimed.

BACKGROUND

Exemplary embodiments relate to a semiconductor memory device and a method of operating the same and, more particularly, to a page buffer including a dynamic latch and a sense operation using the page buffer.

A semiconductor memory device includes page buffers for storing external program data when a program operation is performed and a memory cell array for storing data depending on the program data stored in the page buffers.

Furthermore, the page buffer performs a sense operation for a program verification operation in a program operation and, in a read operation, performs an operation of sensing the voltage level of a bit line, shifting depending on whether a selected memory cell has been programmed, and storing the voltage level in the form of data.

The page buffer may perform the sense operation by controlling the level of voltage supplied to the gate of an NMOS transistor or a PMOS transistor. However, the method of controlling the level of voltage supplied to the gate of the transistor may reach limits as to a fine sense operation.

For example, the sense operation of the page buffer using only a static latch is described as follows. When a read voltage is supplied to a word line coupled to a selected memory cell, the voltage level of a precharged bit line shifts or remains intact depending on the level of a threshold voltage of the selected memory cell. When the voltage level of the bit line is determined as described above, the page buffer senses the voltage level of the bit line and outputs data of the latch which changes or remains intact depending on the sensed voltage level. Next, a control circuit determines whether the data outputted from the page buffer is '1' or '0'.

The sense operation of the page buffer using the dynamic latch is described as follows. The page buffer using the dynamic latch determines the voltage level of the bit line depending on data of the selected memory cell. The page buffer stores the determined voltage level of the bit line in a sense latch, compares the data stored in the sense latch and the data stored in the dynamic latch, and outputs data corresponding to a result of the comparison. Next, the control circuit determines whether the data outputted from the page buffer is '1' or '0'.

As described above, a conventional page buffer performs the sense operation by sending the amount of current flowing depending on a voltage supplied to the gate of the transistor. However, such a sense method may reach limits in measuring a shift in fine current level of nano ampere (nA).

BRIEF SUMMARY

According to exemplary embodiments, an analog signal shifting depending on a level of the threshold voltage of a selected memory cell is compared with a reference current of signal, and sense data of a digital signal is outputted as a result of the comparison. Accordingly, the threshold voltage of the selected memory cell can be finely sensed.

A semiconductor memory device according to an aspect of the present disclosure includes a memory cell array including cell strings each including a plurality of memory cells; bit lines coupled to the respective cell strings; and page buffers configured to compare a reference current and currents of the respective bit line and output sense data corresponding to a level of a threshold voltage of a selected memory cell based on a result of the comparison, in a sense operation.

A method of operating a semiconductor memory device according to another aspect of this disclosure includes setting a reference current for a sense operation; precharging a bit line coupled to a memory cell to be sensed; supplying a sense voltage to a word line coupled to the memory cell; and comparing the reference current and the current of the bit line and outputting a result of the comparison as sense data of the memory cell.

BRIEF DESCRIPTION OF THE DRAWINGS

FIG. 6 is a timing diagram illustrating a sense operation using the semiconductor memory device according to an exemplary embodiment of this disclosure.

DESCRIPTION OF EMBODIMENTS

Hereinafter, some exemplary embodiments of the present disclosure will be described in detail with reference to the accompanying drawings. The figures are provided to enable those of ordinary skill in the art to make and use the embodiments of the disclosure.

Figure 1:
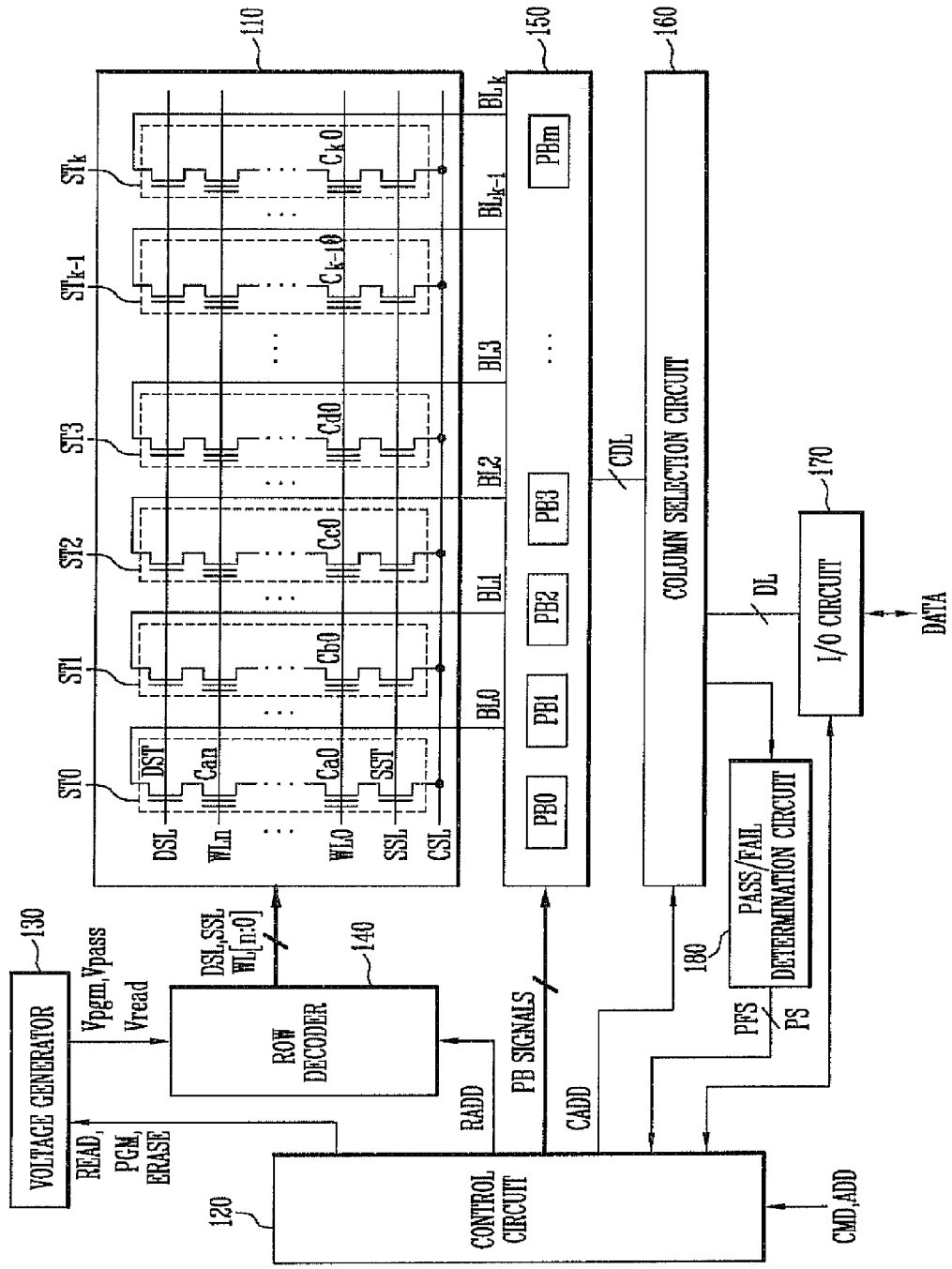
FIG. 1 is a block diagram of a semiconductor memory device according to an exemplary embodiment of this disclosure.

FIG. 1 is a block diagram of a semiconductor memory device according to an exemplary embodiment of this disclosure.

The semiconductor memory device includes a memory cell array 110, an operation circuit group (130, 140, 150, 160, 170, and 180) for performing a program operation or a read operation on the memory cells of the memory cell array 110, and a control circuit 120 for controlling the operation circuit group (130, 140, 150, 160, 170, and 180).

Here, the semiconductor memory device may be an NAND flash memory device. Further, the operation circuit group may include a voltage generator 130, a row decoder 140, a page buffer group 150, a column selection circuit 160, an I/O circuit 170, and a pass/fail determination circuit 180.

The memory cell array 110 may include a plurality of memory blocks. For convenience, FIG. 1 shows only one of the memory blocks. The memory block includes a plurality of strings ST0 to STk. Each of the strings ST0 and STk includes a source select transistor SST coupled to a common source line CSL, a plurality of memory cells Ca0 to Can, and a drain select transistor DST coupled to a bit line BL0. The gate of the source select transistor SST is coupled to a source selection line SSL, and the gates of the memory cells Ca0 to Can are coupled to respective word lines WL0 to WLn. The gate of the drain select transistor DST is coupled to a drain selection line DSL. The strings ST1 to STk are coupled to respectively bit lines BL1 to BLk and are commonly coupled to the common source line CSL.

A control circuit 120 internally generates a program operation signal PGM, a read operation signal READ, or an erase operation signal ERASE in response to a command signal CMD and generates control signals PB SIGNALS for controlling the page buffers of the page buffer group 150 depending on the type of the operation. Furthermore, the control circuit 120 internally generates a row address signal RADD and a column address signal CADD in response to an address signal ADD. Furthermore, the control circuit 120 checks whether the threshold voltages of selected memory cells have risen to a minimum target voltage level in response to a count signal PS generated by the pass/fail determination circuit 180 when a program verification operation is performed and determines whether to perform a program operation again depending on a result of the check.

The voltage supply circuit (130 and 140) supplies operation voltages for the program operation, the erase operation, or the read operation of memory cells to the drain selection line DSL, the word lines WL0 to WLn, and the source selection line SSL of a selected memory block in response to the signals READ, PGM, ERASE, and RADD of the control circuit 120. The voltage supply circuit includes the voltage generator 130 and the row decoder 140.

The voltage generator 130 outputs the operation voltages (for example, Vpgm, Vpass, and Vread) for programming, reading, or erasing memory cells to global lines in response to the operation signals PGM, READ, ERASE (that is, the internal command signals of the control circuit 120).

The row decoder 140 transfers the operation voltages of the voltage generator 130 to the cell strings ST0 to STk of a memory block, selected from among the memory blocks of the memory cell array 110, in response to the row address signals RADD of the control circuit 120. The operation voltages are supplied to the local lines DSL, WL[0:n], and SSL of the selected memory block.

The page buffer group 150 includes the page buffers PB0 to PBm coupled to the respective bit lines BL0 to BLk. The page buffer group 150 supplies voltage used to store data in the memory cells Ca0 to Ck0 to the bit lines BL1 to BLk in response to the control signals PB SIGNALS of the control circuit 120. More particularly, when the program operation, the erase operation, or the read operation of the memory cells Ca0 to Ck0 is performed, the page buffer group 150 precharges the bit lines BL0 to BLk and latches data corresponding to the levels of threshold voltages of the memory cells Ca0 to Ck0 which are detected depending on a shift in the voltage levels of the bit lines BL0 to BLk. In other words, the page buffer group 150 controls the voltages of the bit lines BL1 to BLk based on data stored in the memory cells Ca0 to Ck0 and detects data stored in the memory cells Ca0 to Ck0.

The column selection circuit 160 selects the page buffers of the page buffer group 150 in response to the column address signal CADD of the control circuit 120 and transfers data, received from an I/O circuit 170, to a selected page buffer through a column data line CDL.

When a program operation is performed, the I/O circuit 170 transfers data to the column selection circuit 160 under the control of the control circuit 120 in order to input external input data to the page buffer group 150. When the column selection circuit 160 sequentially transfers the received data to the page buffers of the page buffer group 150, the page buffers stores the received data in their internal latches. Furthermore, when a read operation is performed, the I/O circuit 170 externally outputs data received from the page buffers of the page buffer group 150 through the column selection circuit 160.

The pass/fail determination circuit 180 checks whether there is an error cell having a threshold voltage lower than a target voltage among programmed memory cells in a program verification operation performed after a program operation and outputs a result of the check as a check signal PFS. The pass/fail determination circuit 180 also performs a function of counting the number of error memory cells and outputting a result of the count as the count signal PS.

When the program operation of memory cells is performed, the control circuit 120 controls the voltage generator 130 so that the level of a program voltage supplied to a selected word line can be controlled, and verification voltages can be selectively supplied to the selected word line when a program verification operation is performed. Here, the control circuit 120 may control the voltage generator 130 in response to the count signal PS of the pass/fail determination circuit 180.

Figure 2:
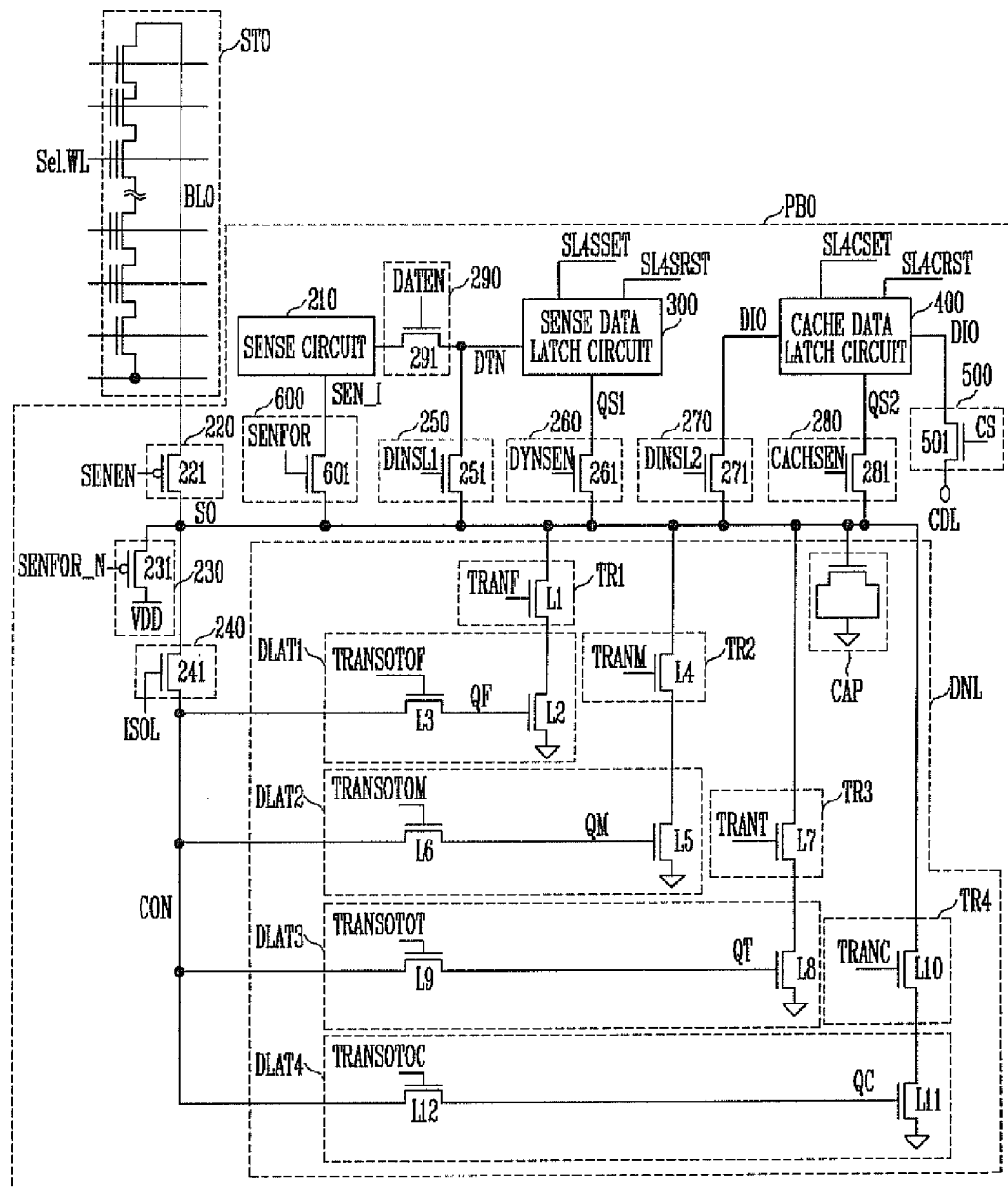
FIG. 2 is a detailed circuit diagram of a page buffer shown in FIG. 1.

FIG. 2 is a detailed circuit diagram of the page buffer shown in FIG. 1.

For illustration purposes, FIG. 2 shows a page buffer PB0 among the plurality of page buffers and the page buffer PB0 is illustrated to be coupled to the cell string ST0. However, the page buffer may be coupled to one or more cell strings, for example, two cell strings. If the page buffer is coupled to two cell strings, the page buffer may send or receive data to/from a selected cell string. In the present embodiment, an example that one cell string ST0 is coupled to one page buffer PB0 is described.

The page buffer PB0 includes a sense circuit 210, a second sense voltage transfer circuit 600, a first sense voltage transfer circuit 220, a precharge circuit 230, a first transmission circuit 240, a second transmission circuit 250, a third transmission circuit 260, a fourth transmission circuit 270, a fifth transmission circuit 280, a data enable circuit 290, a sense data latch circuit 300, a cache data latch circuit 400, an I/O data transfer circuit 500, and a dynamic latch DNL.

The sense circuit 210 compares reference current and the current of a sense node SO which shifts depending on the threshold voltage of a selected memory cell and outputs sense data of '1' or '0' depending on a result of the comparison. A detailed configuration and operation of the sense circuit 210 is described later.

The second sense voltage transfer circuit 600 includes a switch 601 for transferring voltage, supplied to the sense node SO, to the sense circuit 210 in response to a sense start signal SENFOR. To this end, the switch 600 may include an NMOS transistor operating in response to the sense start signal SENFOR.

The first sense voltage transfer circuit 220 includes a switch 221 for coupling the sense node SO to the bit line BL0 in response to a first sense voltage transfer signal SENEN. The switch 221 may include a PMOS transistor activated when the bit line BL0 is precharged or a shifted voltage of the bit line BL0 is transferred to the sense node SO.

The precharge circuit 230 includes a switch 231 for precharging the sense node SO in response to an inverse sense start signal SENFOR_N. The switch 231 couples a power supply terminal VDD to the sense node SO in response to the inverse sense start signal SENFOR_N, and it may include a PMOS transistor.

The first transmission circuit 240 includes a switch 241 for sending data, supplied to the sense node SO, to the dynamic latch DNL in response to a first transmission signal ISOL. To this end, the switch 241 may include an NMOS transistor for coupling the sense node SO and a common node CON together in response to the first transmission signal ISOL. The dynamic latch DNL stores the data of the common node CON in any selected one of latches DLAT1 to DLAT4.

The second transmission circuit 250 includes a switch 251 for transferring the data of the sense node SO to the sense data latch circuit 300 in response to a second transmission signal DINSL1, The switch 251 may include an NMOS transistor for coupling the sense node SO and the data input node DTN of the sense data latch circuit 300 together in response to the second transmission signal DINSL1.

The third transmission circuit 260 includes a switch 261 for transferring data, stored in the sense data latch circuit 300, to the sense node SO in response to a third transmission signal DYNSEN. The switch 261 may include an NMOS transistor for coupling the sense node SO and the first input node QS1 of the sense data latch circuit 300 together in response to the third transmission signal DYNSEN.

The fourth transmission circuit 270 includes a switch 271 for transferring the data of the sense node SO to the cache data latch circuit 400 in response to a fourth transmission signal DINSL2. The switch 271 may include an NMOS transistor for coupling the sense node SO and the data I/O node DIO of the cache data latch circuit 400 together in response to the fourth transmission signal DINSL2.

The fifth transmission circuit 280 includes a switch 281 for transferring data, stored in the cache data latch circuit 400, to the sense node SO in response to a fifth transmission signal CACHSEN. The switch 281 may include an NMOS transistor for coupling the sense node SO and the second input node QS2 of the cache data latch circuit 400 together in response to the fifth transmission signal CACHSEN.

The data enable circuit 290 includes a switch 291 for transferring sense data, outputted from the sense circuit 210, to the sense data latch circuit 300. The switch 291 may include an NMOS transistor operating in response to a data enable signal DATEN.

When the sense data is transferred to the data input node DTN, the sense data latch circuit 300 stores the sense data and transfers the stored data to the sense node SO.

The cache data latch circuit 400 functions to store program data or output the program data through the I/O node DIO.

The I/O data transfer circuit 500 includes a switch 501 for transferring program data, received from the column selection circuit (160 of FIG. 1) through the column data line CDL, to the I/O node DIO in response to the column selection signal CS. To this end, the switch 501 may include an NMOS transistor operating in response to the column selection signal CS.

The dynamic latch DNL includes the first to fourth latches DLAT1 to DLAT4 for storing data, first to fourth latch data transmission circuits TR1 to TR4 for transferring the data of the latches to the sense node SO, and a capacitor CAP for charging the sense node SO.

The first to fourth latches DLAT1 to DLAT4 include respective switches L3, L6, L9, and L12 coupled to the common node CON and configured to transfer data, supplied to the common node CON, to respective latch nodes QF, QM, QT, and QC. The switches L3, L6, L9, and L12 may include NMOS transistors operating in response to first to fourth latch input signals TRANSOTOF, TRANSOTOM, TRANSOTOT, and TRANSOTOC, respectively. Furthermore, the first to fourth latches DLAT1 to DLAT4 include respective switches L2, L5, L8, and L11 operating in response to data stored in the respective latch nodes QF, QM, QT, and QC. The drains of the switches L2, L5, L8, and L11 are coupled to a ground terminal VSS. Accordingly, when data stored in the latch node QF, QM, QT, or QC is '0', the source of the switch L2, L5, L8, or L11 maintains a previous floating state. When data stored in the latch node QF, QM, QT, or QC is '1', the source of the switch L2, L5, L8, or L11 has a voltage level of a low logic level because it is discharged.

Figure 3:
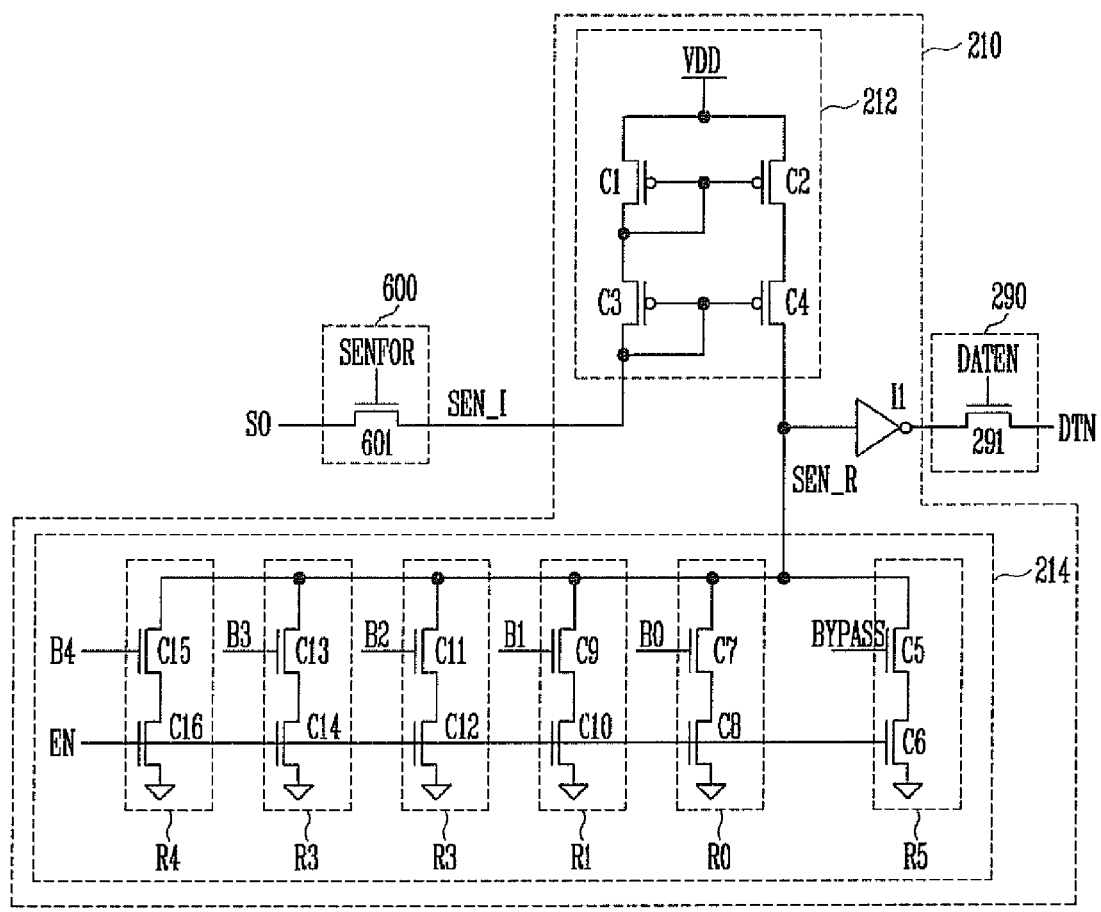
FIG. 3 is a detailed circuit diagram of a sense circuit shown in FIG. 2.

FIG. 3 is a detailed circuit diagram of the sense circuit shown in FIG. 2.

The sense circuit 210 includes a current mirror circuit 212, a current sink circuit 214, and an inverter IL When the second sense voltage transfer circuit 600 is activated, current flows through the input terminal SEN_I of the current mirror circuit 212 by the amount of current flowing through the sense node SO. That is, the voltage level of the input terminal SEN_I shifts depending on a voltage level of the sense node SO. In view of the characteristic of the current mirror circuit 212, the current of the input terminal SEN_I is identical to the current of the output terminal SEN_R. That is, the current of the input terminal SEN_I is mirrored, so that the same current as that of the input terminal SEN_I flows through the output terminal SEN_R. The current mirror circuit 212 is described as follows. The current mirror circuit 212 includes first to fourth current switches C1 to C4. Each of the first to fourth current switches C1 to C4 may include a PMOS transistor. The gates of the third current switch C3 and the fourth current switch C4 are coupled together, the drain of the third current switch C3 is coupled to the input terminal SEN_I of the current mirror circuit 212, and the source of the fourth current switch C4 is coupled to the output terminal SEN_R of the current mirror circuit 212. The gates of the first current switch C1 and the second current switch C2 are coupled together, the drain of the first current switch C1 is coupled to the source of the third current switch C3, and the source of the second current switch C2 is coupled to the drain of the fourth current switch C4. The source of the first current switch C1 and the drain of the second current switch C2 are coupled to the power supply terminal VDD.

The current sink circuit 214 determines the voltage level of the output terminal SEN_R of the current mirror circuit 212 by comparing reference current and current of sensed data of a memory cell. The reference current may be set to, for example, 100 nA, 300 nA, 500 nA, or 700 nA. The reference current may be set to various values in addition to the above described values.

The current sink circuit 214 is described as follows. The current sink circuit 214 includes a reference discharge circuit R5 and a plurality of selection discharge circuits R0 to R4. In particular, the current of the output terminal SEN_R of the current mirror circuit 212 can be controlled by the reference discharge circuit R5 and the plurality of selection discharge circuits R0 to R4.

The reference discharge circuit R5 and the selection discharge circuits R0 to R4 include respective enable switches C6, C8, C10, C12, C14, and C16, operating in response to an enable signal EN, and respective selection switches C5, C7, C9, C11, C13, and C15 through which different amounts of currents flow. The enable switches C6, C8, C10, C12, C14, and C16 operate in response to the enable signal EN of a high level. The selection switches C5, C7, C9, C11, C13, and C15 operate in response to respective signals BYPASS, B0, B1, B2, B3, and B4. In particular, the reference current can be controlled by making different the respective current values of the selection switches C5, C7, C9, C11, C13, and C15 and adjusting the number of activated selection switches C5, C7, C9, C11, C13, and C15. To this end, the selection switches C5, C7, C9, C11, C13, and C15 may be implemented using respective single switch elements which have different current amounts or may be implemented by grouping a different number of switch elements each having the same current amount, for example, NMOS transistors. When the selection switch C7 of the first selection discharge circuit R0 is constructed of one NMOS transistor, for example, the selection switch C9 of the second selection discharge circuit R1 may be constructed of a group of two NMOS transistors. The selection switch C11 of the third selection discharge circuit R2 may be constructed of a group of four NMOS transistors. The selection switch C13 of the fourth selection discharge circuit R3 may be constructed of a group of eight NMOS transistors. The selection switch C15 of the fifth selection discharge circuit R4 may be constructed of a group of sixteen NMOS transistors.

The reference discharge circuit R5 has the enable switch C6 and the selection switch C5 coupled in series between the output terminal SEN_R and the ground terminal VSS. In the embodiment of the present disclosure, the five selection discharge circuits R0 to R4 are illustrated, but the number of selection discharge circuits may be changed. When the switch groups consisting of different numbers of the NMOS transistors as described above are selectively activated, the reference current of the output terminal SEN_R can be set to have various values. In particular, in a sense operation, after a bit line is precharged, the threshold voltage of a selected memory cell can be sensed by comparing the reference current and current of the bit line changing depending on a level of the threshold voltage of the selected memory cell. In other words, when current flowing through the sense node SO is lower than the reference current, a voltage of the output terminal SEN_R may remain in a low level.

Here, the current sink circuit 214 can secure margin in the amount of a sensed current up to a reference level set in the semiconductor device. Accordingly, although the amount of a sensed current is reduced, a shift of sense data due to the reduction can be prevented. For example, if the current of the output terminal SEN_R is lowered, the voltage of the output terminal SEN_R rises. The risen voltage supplies data of a high level to the input node of the inverter I1, and thus the inverter I1 outputs the sense data of a low level. Therefore, the current of the output terminal SEN_R may be controlled to prevent the shift of sense data.

Figure 4:
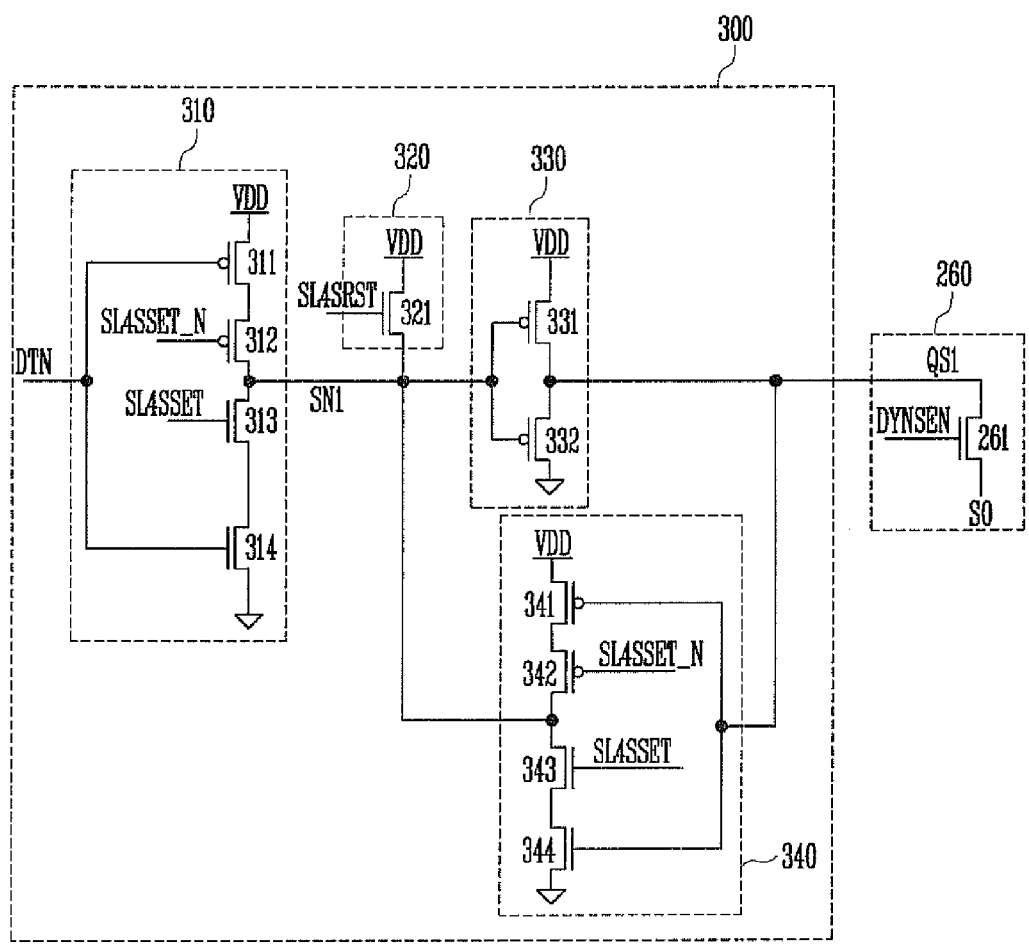
FIG. 4 is a detailed circuit diagram of a sense data latch circuit shown in FIG. 2.

FIG. 4 is a detailed circuit diagram of the sense data latch circuit shown in FIG. 2.

Referring to FIG. 4, the sense data latch circuit 300 includes a first sense inverter 310, a sense latch reset circuit 320, a second sense inverter 330, and a third sense inverter 340.

The first sense inverter 310 includes first to fourth switches 311, 312, 313, and 314 coupled in series between the power supply terminal VDD and the ground terminal VSS. The first switch 311 may include a PMOS transistor activated in response to the sense data of a low level. The second switch 312 may include a PMOS transistor activated in response to an inverse sense set signal SL4SSET_N of a low level. The third switch 313 may include an NMOS transistor activated in response to a sense set signal SL4SSET of a high level. The fourth switch 314 may include an NMOS transistor activated in response to the sense data of a high level. The output signal of the first sense inverter 310 is outputted to a first node SN1 between the second and third switches 312 and 313.

The sense latch reset circuit 320 includes a fifth switch 321 coupled between the power supply terminal VDD and the first node SN1. The sense latch reset circuit 320 resets the first node SN1 to have a high level in response to a sense reset signal SL4SRST of a high level. The fifth switch 321 may include an NMOS transistor.

The second sense inverter 330 includes sixth and seventh switches 331 and 332 coupled in series between the power supply terminal VDD and the ground terminal VSS. The sixth switch 331 may include a PMOS transistor, and the seventh switch 332 may include an NMOS transistor. When a signal of a high level is supplied to the first node SN1, the second sense inverter 330 outputs an output signal of a low level to a first input node QS1 between the sixth and seventh switches 331 and 332. When a signal of a low level is supplied to the first node SN1, the second sense inverter 330 outputs an output signal of a high level to the first input node QS1. Accordingly, the output signal supplied to the first input node QS1 varies depending on the sense data supplied to the sense data latch circuit 300.

The third sense inverter 340 includes eighth to eleventh switches 341, 342, 343, and 344 coupled in series between the power supply terminal VDD and the ground terminal VSS. The eighth switch 341 may include a PMOS transistor activated in response to the output signal of a low level. The ninth switch 342 may include a PMOS transistor in response to an inverse sense set signal SL4SSET_N of a low level. The tenth switch 343 may include an NMOS transistor activated in response to a sense set signal SL4SSET of a high level. The eleventh switch 344 may include an NMOS transistor in response to the output signal of a high level. An output signal of the third sense inverter 340 is outputted to the first node SN1 between the ninth and tenth switches 342 and 343.

Figure 5:
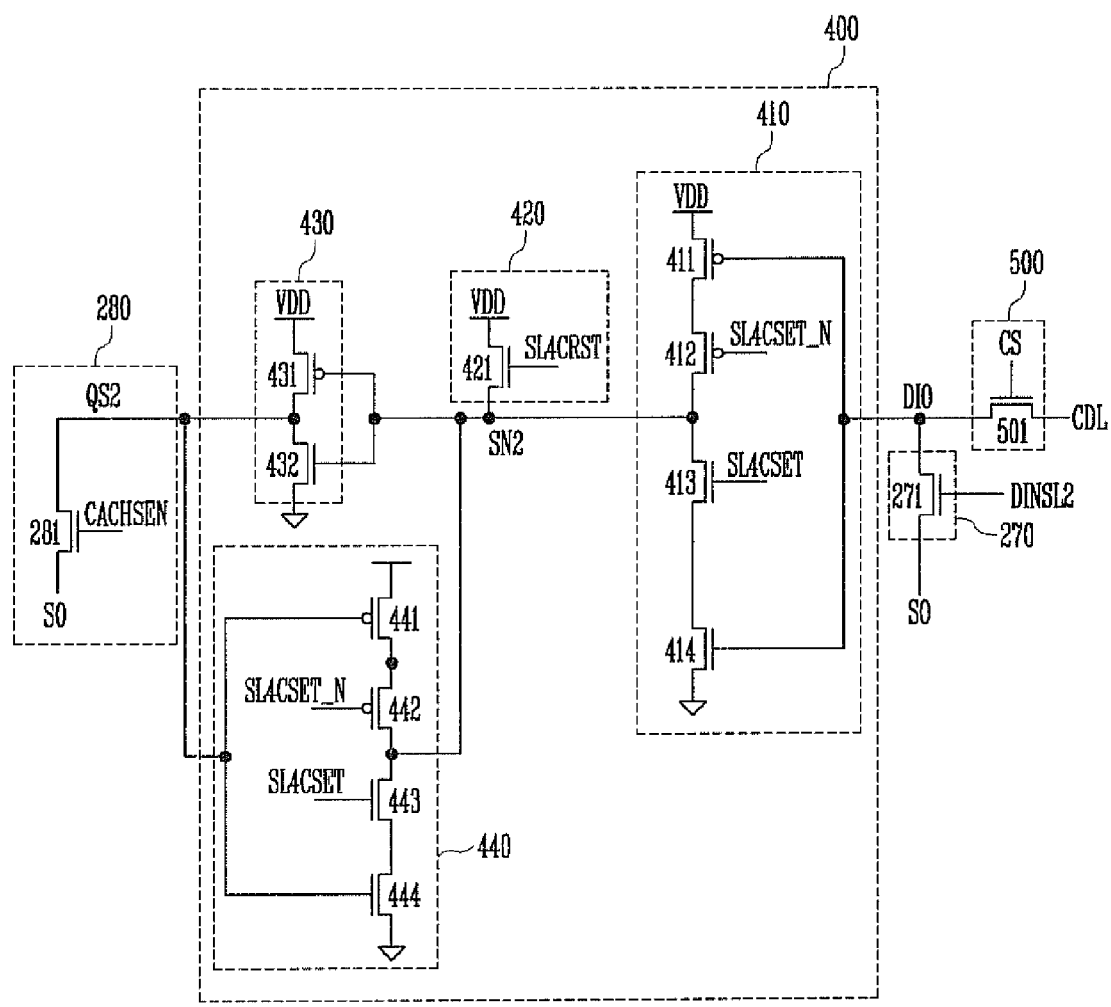
FIG. 5 is a detailed circuit diagram of a cache data latch circuit shown in FIG. 2.

FIG. 5 is a detailed circuit diagram of the cache data latch circuit shown in FIG. 2.

Referring to FIG. 5, the cache data latch circuit 400 includes a first cache inverter 410, a cache latch reset circuit 420, a second cache inverter 430, and a third cache inverter 440.

The first cache inverter 410 stores input data received via the I/O node DIO when a program operation is performed and outputs the data through the second input node QS2. The first cache inverter 410 includes twelfth to fifteenth switches 411, 412, 413, and 414 coupled in series between the power supply terminal VDD and the ground terminal VSS. The twelfth the switch 411 may include a PMOS transistor activated in response to the input data of a low level. The thirteenth switch 412 may include a PMOS transistor activated in response to an inverse cache set signal SL4CSET_N of a low level. The fourteenth switch 413 may include an NMOS transistor activated in response to a cache set signal SL4CSET of a high level. The fifteenth switch 414 may include an NMOS transistor activated in response to the input data of a high level. The output signal of the first cache inverter 410 is outputted to a second node SN2 between the thirteenth and fourteenth switches 412 and 413.

The cache latch reset circuit 420 includes a sixteenth switch 421 coupled between the power supply terminal VDD and the second node SN2 and resets the second node SN2 to have a high level in response to a cache reset signal SL4CRST of a high level. The sixteenth switch 421 may include an NMOS transistor.

The second cache inverter 430 includes seventeenth and eighteenth switches 431 and 432 coupled in series between the power supply terminal VDD and the ground terminal VSS. The seventeenth switch 431 may include a PMOS transistor, and the eighteenth switch 432 may include an NMOS transistor. The second cache inverter 430 outputs an output signal of a low level to the second input node QS2 between the seventeenth and eighteenth switches 431 and 432 when a signal of a high level is supplied to the second node SN2. The second cache inverter 430 outputs an output signal of a high level when a signal of a low level is supplied to the second node SN2.

The third cache inverter 440 includes nineteenth to twenty-second switches 441, 442, 443, and 444 coupled in series between the power supply terminal VDD and the ground terminal VSS. The nineteenth switch 441 may include a PMOS transistor activated in response to a signal of a low level. The twentieth switch 442 may include a PMOS transistor activated in response to the inverse cache set signal SL4CSET_N of a low level. The twenty-first the switch 443 may include an NMOS transistor activated in response to the cache set signal SL4CSET of a high level. The twenty-second switch 444 may include an NMOS transistor activated in response to data of a high level. The output signal of the third cache inverter 440 is outputted to the second node SN2 between the twentieth and twenty-first switches 412 and 413.

FIG. 6 is a timing diagram illustrating a sense operation using the semiconductor memory device according to an exemplary embodiment of this disclosure.

The sense operation is performed to sense the voltage level of a bit line shifting depending on the level of the threshold voltage of a selected memory cell and determine the level of the threshold voltage of the selected memory cell based on the sensed voltage level. Accordingly, when the sense operation starts, the bit line is first precharged, and a verification voltage or a read voltage is supplied to a word line coupled to the selected memory cell depending on the types of the sense operation. When a relevant voltage is supplied to the word line, a current path is formed or not formed depending on the level of a threshold voltage of the selected memory cell. If the current path is formed, the precharged voltage level of the bit line is lowered. If the current path is not formed, the precharged voltage level of the bit line remains intact. Accordingly, the level of a threshold voltage of the selected memory cell can be determined by sensing a shifted voltage level of the bit line. The sense operation is described as follows in more detail.

At a point of time T1 when a bit line precharge section T1 to T3 starts, the inverse sense start signal SENFOR_N is activated in order to precharge the sense node SO. Since the inverse sense start signal SENFOR_N is activated to a low level, the precharge circuit 230 is activated and thus the sense node SO is precharged to the level of the power supply voltage VDD. At the point of time T2, the first sense voltage transfer signal SENEN is activated to couple the precharged sense node SO and the bit line BL together. Accordingly, the bit line BL is precharged to the level of the power supply voltage VDD.

At a point of time T3 when a sense section T3 to T10 starts, the inverse sense start signal SENFOR_N is deactivated, and the first sense voltage transfer signal SENEN is deactivated. At the point of time T4, respective driving voltages are supplied to the word lines WL, the drain selection line DSL, and the source selection line SSL. For example, a turn-on voltage is supplied to the drain selection line DSL and the source selection line SSL. A read voltage or a verification voltage is supplied to a word line selected from among the word lines WL, and a pass voltage is supplied to the remaining unselected word lines. When the driving voltages are supplied to the word lines, the voltage level of the precharged bit line BL may maintain a high level (602) or drop to a low level depending on the threshold voltages of memory cells. Here, even when the voltage level of the precharged bit line BL maintains a high level, the voltage level of the precharged bit line BL may slightly drop because of the leakage, etc. (604).

At the point of time T5, in order to sense the voltage level of the bit line BL, the sense start signal SENFOR and the first sense voltage transfer signal SENEN are activated, and the signals B<4:0> supplied to the respective selection discharge circuits R0 to R4 of the current sink circuit 214 are selectively activated. When the sense start signal SENFOR and the first sense voltage transfer signal SENEN are activated, the voltage level of the bit line BL is transferred to the sense node SO, and the voltage level of the input terminal SEN_I of the sense circuit 210 is also shifted depending on the voltage level of the sense node SO. That is, the amount of current flowing through the bit line BL is shifted depending on the shifted voltage level of the bit line BL, and thus the amount of current flowing through the input terminal SEN_I is also shifted depending on the current amount of the bit line BL.

The current mirror circuit 212 supplies the same amount of the current of the input terminal SEN_I to the output terminal SEN_R. The current sink circuit 214 adjusts the amount of the reference current to control the amount of current sinking from the output terminal SEN_R.

Therefore, when the current flowing through the input terminal SEN_I drops to be lower than the reference current set in the current sink circuit 214, the current supplied to the output terminal SEN_R becomes lower than the current sinking therefrom, and the voltage of the output terminal SEN_R becomes a low level. When the current flowing through the input terminal SEN_I is higher than the reference current (602), the voltage of the output terminal SEN_R becomes a high level. Accordingly, the sense data can be prevented from being changed by adjusting the value of the reference current of the current sink circuit 214.

At the point of time T6, the sense data latch circuit 300 is reset by activating the sense reset signal SL4SRST. That is, when the sense reset signal SL4SRST of a high level is supplied to the sense latch reset circuit 320, the first node SN1 and the power supply terminal VDD are coupled together, and thus the first node SN1 is precharged to a high level. When the voltage level of the first node SN1 shifts to a high level, data of a low level is supplied from the second sense inverter 330 to the first input node Q51. At the point of time T7, when the data enable signal DATEN is activated, a result sensed by the sense circuit 210 is transferred to the data input node DTN.

At the point of time T8, when the sense set signal SL4SSET is activated, the first sense inverter 310 and the third sense inverter 340 of the sense data latch circuit 300 are activated, and thus the sensed result transferred to the data input node DTN is inputted to the first input node QS1. At the point of time T9, the sense start signal SENSOR and the first sense voltage transfer signal SENEN are deactivated. In the section subsequent to the point of time T10, the data inputted to the first input node QS1 is transferred to the sense node SO, Accordingly, the threshold voltage of a selected memory cell can be sensed by comparing the data of the sense node SO and data inputted to a selected one of the latches DLAT1 to DLAT4 (that is, a latch in which program data is stored).

According to the present disclosure, since the threshold voltage of a selected memory cell can be sensed by measuring the corresponding current by unit amount of nano ampere (nA), reliability of a sense operation performed in a read operation and various verification operations can be increased.

What is claimed is:
1. A semiconductor memory device, comprising:
  a memory cell array comprising cell strings coupled to bit lines, wherein each string includes a plurality of memory cells coupled to word lines;
  a voltage generator configured to output operation voltages for programming, reading or erasing the memory cells to global lines;

a row decoder configured to transfer the operation voltages from the global lines to the word lines; and page buffers configured to compare a current of the respective bit lines and a reference current, and output sense data as a result of the comparison, in a sense operation, wherein the current of the respective bit lines is shifted according to a level of a threshold voltage of the respective memory cells.

2. The semiconductor memory device of claim 1, wherein each of the page buffers comprises:

a precharge circuit configured to precharge a sense node;

a first sense voltage transfer circuit configured to precharge the bit line by coupling the bit line to the precharged sense node and transfer a voltage of the bit line, shifted in response to the threshold voltage of the selected memory cell, to the sense node;

a sense circuit configured to compare a current of the sense node and the reference current and output a result of the comparison as the sense data;

a sense data latch circuit configured to store the sense data and transfer the stored sense data to the sense node;

a cache data latch circuit configured to transfer program data, received through an I/O node, to the sense node in a program operation;

a transfer circuit configured to transfer data of the sense node to a common node; and a dynamic latch configured to store data of the common node and transfer the stored sense data to the sense node.

3. The semiconductor memory device of claim 2, wherein the page buffer further comprises a second sense voltage transfer circuit configured to change a level of a current of an input terminal of the sense circuit in response to the current of the sense node in the sense operation.

4. The semiconductor memory device of claim 2, wherein the first sense voltage transfer circuit includes an NMOS transistor configured to couple the bit line and the sense node together in response to a first sense voltage transfer signal in the program operation or the sense operation.

5. The semiconductor memory device of claim 2, wherein the precharge circuit includes a PMOS transistor configured to couple a power supply voltage terminal and the sense node together in response to a precharge signal.

6. The semiconductor memory device of claim 2, wherein the sense circuit comprises:

a current mirror circuit having an input terminal coupled to the sense node and an output terminal for outputting the sense data, wherein an identical amount of current flows through the input and output terminals; and a current sink circuit configured to set a level of the reference current and adjust a voltage of the output terminal by comparing the reference current and a current of the output terminal.

7. The semiconductor memory device of claim 6, wherein the current mirror circuit comprises:

a first switch including a PMOS transistor having a drain and a gate coupled to the input terminal;

a second switch including a PMOS transistor having a gate coupled to the input terminal and a source coupled to the output terminal;

a third switch including a PMOS transistor having a drain and a gate coupled to a source of the first switch and a source coupled to a power supply voltage terminal; and a fourth switch including a PMOS transistor having a drain coupled to the power supply voltage terminal, a gate coupled to the gate of the third switch, and a source coupled to a drain of the second switch.

8. The semiconductor memory device of claim 6, wherein the current sink circuit comprises a plurality of selection discharge circuits coupled in parallel between a ground voltage terminal and the output terminal of the current mirror circuit.

9. The semiconductor memory device of claim 8, wherein the selection discharge circuits are configured to make different amount of currents flow therethrough in response to an enable signal.

10. The semiconductor memory device of claim 8, wherein the selection discharge circuits comprises a different number of NMOS transistors coupled in series between the output terminal and the ground voltage terminal from one another.

11. The semiconductor memory device of claim 8, wherein the reference current is set by controlling a number of activated circuits among the selection discharge circuits.

12. The semiconductor memory device of claim 11, wherein:

when a current of the input terminal is lower than the reference level, the sense data of a low logic level is outputted through the output terminal, and when the current of the input terminal is higher than the reference level, the sense data of a high logic level is outputted through the output terminal.

13. The semiconductor memory device of claim 2, wherein the sense data latch circuit comprises:

a first sense inverter configured to invert the sense data and output the inverted sense data to a first node;

a sense reset circuit configured to reset the sense data latch circuit by supplying a power supply voltage to the first node;

a second sense inverter configured to invert a voltage of the first node and output the inverted voltage to a first input node; and a third sense inverter configured to invert a voltage of the first input node and transfer the inverted voltage to the first node.

14. The semiconductor memory device of claim 13, wherein the first sense inverter comprises first to fourth switches coupled in series between a power supply voltage terminal and a ground voltage terminal, wherein the first switch includes a PMOS transistor for coupling the power supply voltage terminal and the second switch together in response to the sense data, the second switch includes a PMOS transistor for coupling the first switch and the first node together in response to an inverse sense set signal, the third switch includes an NMOS transistor for coupling the first node and the fourth switch together in response to a sense set signal, and the fourth switch includes an NMOS transistor for coupling the third switch and the ground voltage terminal together in response to the sense data.

15. The semiconductor memory device of claim 13, wherein the sense reset circuit includes an NMOS transistor for coupling a power supply voltage terminal and the first node together in response to a sense reset signal.

16. The semiconductor memory device of claim 13, wherein the third sense inverter comprises first to fourth switches coupled in series between a power supply voltage terminal and a ground voltage terminal, wherein the first switch includes a PMOS transistor for coupling the power supply voltage terminal and the second switch together in response to the voltage of the first input node, the second switch includes a PMOS transistor for coupling the first switch and the first node together in response to an inverse sense set signal, the third switch includes an NMOS transistor for coupling the first node and the fourth switch together in response to a sense set signal, and the fourth switch includes an NMOS transistor for coupling the third switch and the ground voltage terminal together in response to the voltage of the first input node.

17. The semiconductor memory device of claim 2, wherein the cache data latch circuit comprises:
   a first cache inverter configured to invert the program data of the I/O node and output the inverted data to a second node;
   a cache reset circuit configured to reset the cache data latch circuit by supplying a power supply voltage the second node;
   a second cache inverter configure to invert a voltage of the second node and output the inverted voltage to a second input node; and
   a third cache inverter configured to invert a voltage of the second input node and transfer the inverted voltage to the second node.

18. The semiconductor memory device of claim 17, wherein the first cache inverter comprises first to fourth switches coupled in series between a power supply voltage terminal and a ground voltage terminal, wherein the first switch includes a PMOS transistor for coupling the power supply voltage terminal and the second switch together in response to the program data, the second switch includes a PMOS transistor for coupling the first switch and the second node together in response to an inverse cache set signal, the third switch includes an NMOS transistor for coupling the second node and the fourth switch together in response to a cache set signal, and the fourth switch includes an NMOS transistor for coupling the third switch and the ground voltage terminal together in response to the program data.

19. The semiconductor memory device of claim 17, wherein the cache reset circuit includes an NMOS transistor for coupling a power supply voltage terminal and the second node in response to a cache reset signal.

20. The semiconductor memory device of claim 17, wherein the third cache inverter comprises first to fourth switches coupled in series between a power supply voltage terminal and a ground voltage terminal, wherein the first switch includes a PMOS transistor for coupling the power supply voltage terminal and the second switch together in response to the voltage of the second input node, the second switch includes a PMOS transistor for coupling the first switch and the second node in response to an inverse cache set signal, the third switch includes an NMOS transistor for coupling the second node and the fourth switch together in response to a cache set signal, and the fourth switch includes an NMOS transistor for coupling the third switch and the ground voltage terminal together in response to the voltage of the second input node.

21. A method of operating a semiconductor memory device, the method comprising:
   setting a reference current for a sense operation;
   precharging a bit line coupled to a memory cell to be sensed;
   supplying a sense voltage to a word line coupled to the memory cell; and
   comparing the reference current and a current of the bit line and outputting a result of the comparison as sense data of the memory cell,
   wherein the sense data of a high logic level is outputted when the current of the bit line is lower than the reference current, and the sense data of a low logic level is outputted when the current of the bit line is higher than the reference current.

22. The method of claim 21, wherein the reference current is set to various levels.

23. The method of claim 21, further comprising determining whether the memory cell has been programmed by comparing the sense data and data stored in a page buffer, after outputting the sense data.

24. The method of claim 23, wherein determining whether the memory cell has been programmed comprises:
   transferring the sense data to a sense latch;
   transferring data of the sense latch to a sense node;
   transferring data of the sense node to a common node; and
   transferring data of the common node to a dynamic latch.

* * * * *